United States Patent
Bock et al.

(10) Patent No.: US 7,408,491 B2
(45) Date of Patent: Aug. 5, 2008

(54) METHOD FOR DETERMINING AND METHOD FOR COMPENSATING A CHARACTERISTIC OF AN A/D CONVERTER, CIRCUIT ARRANGEMENT FOR DETERMINING SUCH A CHARACTERISTIC, AND A/D CONVERTER CIRCUIT ARRANGEMENT

(75) Inventors: Christian Bock, Freiburg (DE); Miodrag Tereminac, Gundelfingen (DE)

(73) Assignee: Micronas GmbH, Freiburg (DE)

(*) Notice: Subject to any disclaimer, the term of this patent is extended or adjusted under 35 U.S.C. 154(b) by 0 days.

(21) Appl. No.: 11/626,153

(22) Filed: Jan. 23, 2007

(65) Prior Publication Data

US 2007/0188365 A1 Aug. 16, 2007

(30) Foreign Application Priority Data

Jan. 23, 2006 (DE) .................. 10 2006 003 282

(51) Int. Cl.
*H03M 1/10* (2006.01)
(52) U.S. Cl. ..................... 341/120; 341/155
(58) Field of Classification Search .......... 341/120–155
See application file for complete search history.

(56) References Cited

U.S. PATENT DOCUMENTS 5,361,067 A * 11/1994 Pinckley ............ 341/120
6,222,471 B1 * 4/2001 Nagaraj ............ 341/120
6,232,898 B1 5/2001 Nagaraj ............ 341/120
6,690,311 B2 2/2004 Lundin et al. ....... 341/120
6,697,436 B1 * 2/2004 Wright et al. ........ 375/296
2004/0233083 A1 11/2004 Temerinac et al. ..... 1/10

FOREIGN PATENT DOCUMENTS

| DE | 41 38 936 | 6/1993 | .......... 1/8 |
| WO | WO 00/31876 | 6/2000 | .......... 1/10 |
| WO | WO 02/49217 | 6/2002 | .......... 1/10 |

OTHER PUBLICATIONS

Lundin et al., "Optimal Index-Bit Allocation for Dynamic Post-Correction of Analog-to-Digital Converters," IEEE Transactions on Signal Processing, vol. 53, No. 2, Feb. 2005, pp. 660-671.

Lundin et al., "On External Calibration of Analog-to-Digital Converters," Statistical Signal Processing, 2001. Proceedings of the 11th IEEE Signal Processing Workshop, Aug. 6-8, 2001, pp. 377-380. XP010561155.

Tsimbinos et al., "Improved error-table compensation of A/D converters," IEE Proceedings: Circuits Devices and Systems, vol. 144, No. 6, Dec. 1997, pp. 343-349.

(Continued)

*Primary Examiner*—Lam T Mai
(74) *Attorney, Agent, or Firm*—O'Shea Getz, P.C.

(57) ABSTRACT

An analog-to-digital converter circuit arrangement comprising an analog-to-digital converter that receives an analog input signal and provides a digital output signal. A correction device that corrects the digital output signal using multidimensional correction coefficients indicative of a characteristic of the analog-to-digital converter to be compensated for, and provides a corrected digital output signal indicative thereof.

17 Claims, 3 Drawing Sheets

OTHER PUBLICATIONS

Lundin et al., "A Criterion for Optimizing Bit-Reduced Post-Correction of AD Converters," IEEE Transactions on Instrumentation and Measurement, vol. 53, No. 4, Aug. 2004, pp. 1159-1166.

Moulin et al., "On A/D Converter Linearization Using Two-Dimensional Error-Correction Tables," International Conference on Analogue to Digital and Digital to Analogue Conversion, IEE, Sep. 1991, pp. 1-6, XP002225339.

Flynn et al., "CMOS Folding A/D Converters with Current-Mode Interpolation," IEEE Journal of Solid-State Circuits, vol. 31, No. 9, Sep. 1996, pp. 1248-1257.

Händel et al., "A Calibration Scheme for Imperfect Quantizers," IEEE Transactions on Instrumentation and Measurement, vol. 49, No. 5, Oct. 2000, pp. 1063-1068.

Peter Händel, "Predictive Digital Filtering of Sinusoidal Signals," IEEE Transactions on Signal Processing, vol. 46, No. 2, Feb. 1998, pp. 364-374.

John Tsimbinos, "Identification and Compensation of Nonlinear Distortion," Institute for Telecommunications Research, School of Electronic Engineering, University of South Australia, The Levels, South Australia 5095, Feb. 1995.

* cited by examiner

METHOD FOR DETERMINING AND METHOD FOR COMPENSATING A CHARACTERISTIC OF AN A/D CONVERTER, CIRCUIT ARRANGEMENT FOR DETERMINING SUCH A CHARACTERISTIC, AND A/D CONVERTER CIRCUIT ARRANGEMENT

PRIORITY INFORMATION

This patent application claims priority from German patent application 10 2006 003 282.9 filed Jan. 23, 2006, which is hereby incorporated by reference.

BACKGROUND INFORMATION

The invention relates to the field of analog-to-digital converters (ADCs), and in particular to determining and compensating for a characteristic of an analog-to-digital converter (ADC).

An ADC converts an analog input voltage with a generally constant sampling frequency digital output signal. ADCs have the disadvantage of not having an ideal characteristic. Departures from such an ideal characteristic are often termed differential non-linearity (DNL) or integral non-linearity (INL), where DNL denotes a maximum step width error and INL denotes an error between a quantized value and an ideal continuous value.

To reduce these errors, for a known characteristic of the ADC, it is known to add a voltage-dependent correction value to the digital data word. The correction value comes, for example, from a table in which all the voltage-dependent correction values are kept.

The characteristic can be measured by applying a defined and known signal. Such a test signal is usually a voltage ramp, a triangle, or a sinusoidal signal. A compensation circuit designed by Temerinac et. al. measures an ADC by a sinusoidal signal, which is compared at the digital side with a reconstructed ideal sine wave. Parameters for amplitude, phase and d.c. voltage offset of this reconstructed sine are obtained from the converted signal by a phase locked loop (PLL). From the voltage-dependent differences between the converted and the reconstructed signal, the values are formed as coefficients for the correction table. During the functioning of the ADC, these coefficients are subtracted from the input signal of the ADC.

Such a technique is based on a static characteristic without a memory. However, if the ADC has different states depending on the past history of the signal, a static compensation of the characteristic is not sufficient, or not even possible. Instead, one needs to set up and appropriately apply a different set of correction coefficients for the signal, i.e., for each signal history. But this leads to a number of (n+1)-dimensional coefficient fields with n as the number of past sampling values to be considered.

There have been efforts to mathematically describe by models ADCs having memory (Volterra, Wiener), for example, in John Tsimbinos, "*Identification And Compensation of Non-Linear Distortion, The Levels*," Australia 1995, but such models lead to elaborate computations.

There is a need for simplified error compensation for an ADC with memory.

SUMMARY OF THE INVENTION

A test signal is applied to an ADC, digital values of an output signal of the ADC are compared to a desired state of the output signal, and depending on the result of the comparison, at least one coefficient is determined for the later correction of signals being converted from analog to digital, and the at least one coefficient determined is a multidimensional coefficient with at least two dimensions.

The digital values output by an ADC are corrected by at least one coefficient provided for this ADC, and the at least one coefficient used for the correction is a multidimensional coefficient with at least two dimensions.

For each further dimension of the at least one multidimensional coefficient, one may consider an additional input value lying further in the past. The multidimensional processing may consider both a static coefficient and also at least one dynamic coefficient as the multidimensional coefficient.

A repetition rate of the dynamic coefficient may be taken into account. The repetition rate may be set in accordance with a folding structure of the ADC and to set the rate of repetition of a number of correction fields accordingly through a modulation of the ADC.

A number of filter frequencies corresponding to a number of test signal frequencies, may be used to determine the at least one multidimensional coefficient. Notch filtering in which parameters are adjusted may be used such that the fewest possible or no back-folded harmonics fall in regions around test signal frequencies that were used to determine the at least one multidimensional coefficient.

Notch filtering may be used with respect to several test signal frequencies, instead of a PLL (phase locked loop).

The test signal to determine the at least one multidimensional coefficient may be formed from at least two superimposed input signals of different test signal frequencies.

In one embodiment a system includes a signal input to apply a test signal to the ADC, a coefficient determining device for determining at least one coefficient by comparing the digital values of an output signal of the ADC with a desired state of the output signal, and a storage device for storing the at least one coefficient for subsequent correction of the characteristic, where the coefficient determining device determines at least one multidimensional coefficient with at least two dimensions as the basis for correction values for the ADC.

A system may include an ADC, a signal input for applying an analog input signal to the ADC, a signal output for outputting digital values that have been generated by the ADC from the analog input signal, and a correction device for correcting the digital values output by the ADC by at least one supplied coefficient with regard to a characteristic of the ADC, where the correction device corrects the digital values output by the supplied multidimensional coefficient having at least two dimensions coefficient.

The correction device may produce a static correction value and a dynamic correction value and subtract these values from digitized values output by the ADC.

The correction device may produce and employ a static coefficient for generating a static correction value and at least one dynamic coefficient for generating a dynamic correction value.

The correction device may select dynamic coefficients using a modulo circuit, depending on a repetition rate of a converter structure of the ADC for the correction.

The digital values output by the ADC may be applied to an input of a subtraction unit and an input of a delay unit, and one output of the delay unit may be applied to another input of the subtraction unit, and one output of the subtraction unit is applied to the correction device for generation of dynamic correction values in consideration of the dynamic coefficients.

A notch filter may be used to filter the digital values output by the ADC in consideration of test signal frequencies that were used for determining the coefficients and/or with a notch filter for filtering the digital values output by the ADC for providing update values for the coefficients.

Consideration of the last two input values is often enough for the memory length of an ADC. In this way, instead of a one-dimensional correction table with a one-dimensional coefficient, one obtains a correction table with three dimensions or three-dimensional coefficients. Even considering only the last input value and constructing an only two-dimensional correction table with at least one two-dimensional coefficient produces a noticeable improvement as compared to the static model.

By a multidimensional error component or multidimensional coefficient is also meant a breaking up into static and dynamic portions. A dynamic error component comes from the folding architecture of the ADC, for example see Michael P. Flynn, "*CMOS Folding ADCs With Current-Mode Interpolation*", IEEE Journal of Solid-State Circuits 31 No. 9, September 1996, pages 2348 et seq. The dynamic portion, according to the folding structure in the case of a word of digital data, repeats eight times across the modulation width of the ADC. Breaking up of the correction coefficient into a static and a dynamic component leads to an advantageous memory requirement of $(k+k*k/8)$ instead of $k^2$ for a full formation of the coefficient field with k as the number of correction fields across the converter modulation.

To achieve sufficient coverage of the two-dimensional coefficient field, the measurement signal, as a test signal which is applied to the ADC to determine the coefficient, includes a sum of two sinusoidal signals of different frequencies. In order to estimate, at the receiver (A/D) side, the amplitude, frequency, and phase of the two original signals each time to determine the error, one usually employs PLL circuits. Instead of these, however, one preferably works with two notch filters, which substantially reduces the expense of realizing a circuit arrangement for determining multidimensional coefficients. For higher-dimensional coefficient fields to take into account signal events further in the past, one works accordingly with more notch filters.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
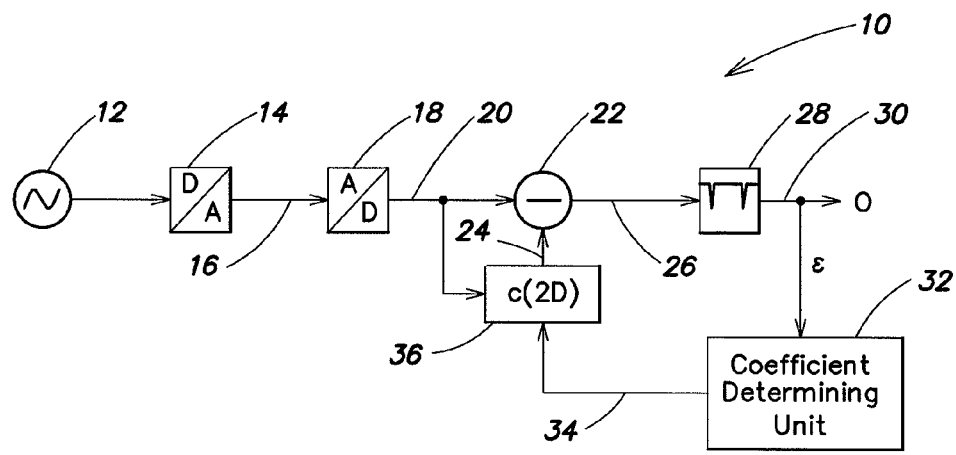
FIG. 1 illustrates a circuit arrangement to determine a characteristic of an ADC and to determine correction coefficients.

FIG. 1 illustrates a system 10 for determining a characteristic of an ADC. The system 10 includes of a plurality of components, which are also used in an ADC circuit arrangement for converting an analog signal into a digital output signal. Accordingly, FIG. 1 shows only one preferred embodiment of a test generator.

The system 10 includes a signal source 12 that comprises one or more oscillators that provides a test signal that is applied to a digital-to-analog converter (DAC) 14, in order to produce an analog test signal a(f1+f2) on the line 16 with two test signal frequencies f1, f2. This analog test signal a (f1+f2) on the line 16 is applied to an ADC 18, whose characteristic is to be determined, in order to carry out corresponding coefficients c(2D), dependent on the characteristic, for later correction of regularly converted digital data. Accordingly, the ADC 18 outputs digital values on a line 20, which are applied to a subtraction unit 22. Correction values on a line 24 are applied at a second input of the subtraction unit 22. The subtraction unit 22 provides a sequence of corrected digital data on a line 26, which are input to two notch filters 28. This notch filtering uses the correction signal frequencies f1, f2. A sequence of values, filtered in this way by the notch filtering, is produced as an output signal on a line 30. Furthermore, the values filtered by the notch filtering or a quantity derived therefrom are supplied as a comparison result to a coefficient determining device 32, which determines and/or updates corresponding coefficients. The coefficients prepared in this way are provided as coefficients c(2D) on line 34 and stored in a coefficient storage device 36, while in the depicted embodiment the coefficient storage device 36 at the same time serves as a device for providing the correction values on the line 24. For this purpose, the sequence of digital values on the line 20 from the ADC 18 is also applied to the device 36 for providing the correction values.

To determine a characteristic field or to determine multidimensional—in the present example, two-dimensional—coefficients c(2D), the ADC 18 is actuated with two sinusoidal signals, which differ in terms of their frequencies in the form of the two test signal frequencies f1, f2. A control loop sets the coefficient field at the deviation to ideal sinusoidal signals.

Figure 2:
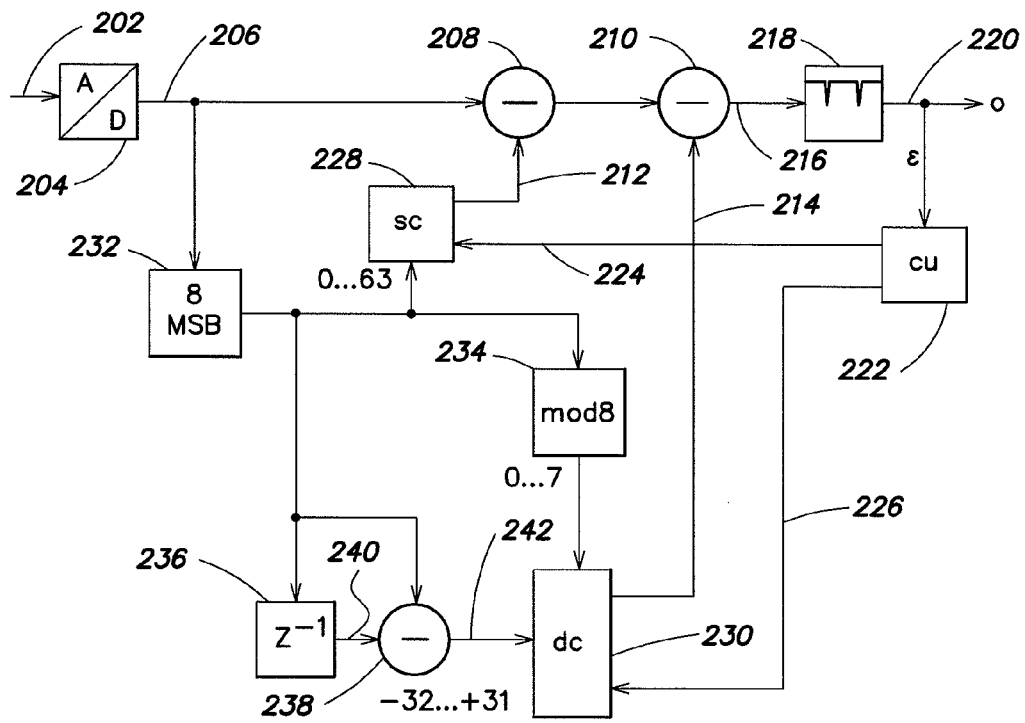
FIG. 2 is a block diagram illustration of an ADC circuit with characteristic compensation making use of multidimensional coefficients.

FIG. 2 is a block diagram illustration of a two-dimensional compensation system with a static component and an eight-fold repeating dynamic component. As compared to the embodiment depicted, it is possible to make modifications, especially in the case of a different number of repeating dynamic components or in the case of a higher-dimensional coefficient field, which can be set up by generating the coefficient by a higher number of test signal frequencies.

Referring to FIG. 2, an analog input signal on a line 202 is input to an ADC 204, which provides digital data on a line 206. The ADC 204 outputs the digital values, which are applied to one or more subtraction units 208, 210 in order to subtract correction values ks, kd on lines 212, 214, respectively. From the series of subtraction units 208, 210, a sequence of correspondingly corrected digital data is provided on a line 216 to a sequence of notch filters 218. The notch filtering takes into account the test signal frequencies f1, f2 that were used to create the coefficients. The notch filters 218 output a series of digital values on a line 220. Furthermore, the series of digital values of the notch filter 218 are applied preferably as a comparison result or value ϵ to a coefficient determining device 222, which determines multidimensional—for example two-dimensional—coefficients on lines 224, 226, respectively, and provides them to corresponding storage devices 228, 230, respectively.

The storage devices 228, 230 are at the same time part of a correction device, which provides from applied digital data on the line 206, possibly being preprocessed, the two correction values or sequences of static and dynamic correction values on lines 212, 214, respectively, which are applied to the subtraction units 208, 210, respectively for subtraction of the digital values output at that instant by the ADC. The digital values which are output by the ADC are also applied to a device 232 for determining and/or selecting the eight most significant bits, which outputs the corresponding values and in the depicted example applies them in a series of 0 . . . 63 to the first storage device 228, in which static coefficients are kept as part of the multidimensional coefficients. The first correction values on the line 212 are generated and applied to the first subtraction unit 208.

The data output by the device 232 for determining the eight most significant bits are applied to a modulo device 234, which uses a repetition rate mod8 corresponding to a converter structure of the ADC. For the present, we shall assume 8-bit words, which are provided by the ADC as the digital data on the line 206. The modulo device 234 accordingly gives delayed data, to the second storage device 230. In the second storage device 230, dynamic coefficients are accordingly produced as a further component of the multidimensional coefficients, and the correction device uses the applied data and the dynamic coefficient to create the additional correction data as dynamic correction data on the line 214 and applies it to the second subtraction unit 210.

Values output by the device 232 for determining the eight most significant bits are also applied to a delay element 236 and a third subtraction unit 238. The delay element 236 performs a delay by a value or a clock period and applies a correspondingly delayed value on a line 240 to the third subtraction unit 238. The output values on a line 242 of the third subtraction unit 238 are applied to the second storage device 230 which holds the dynamic coefficients.

Figure 3:
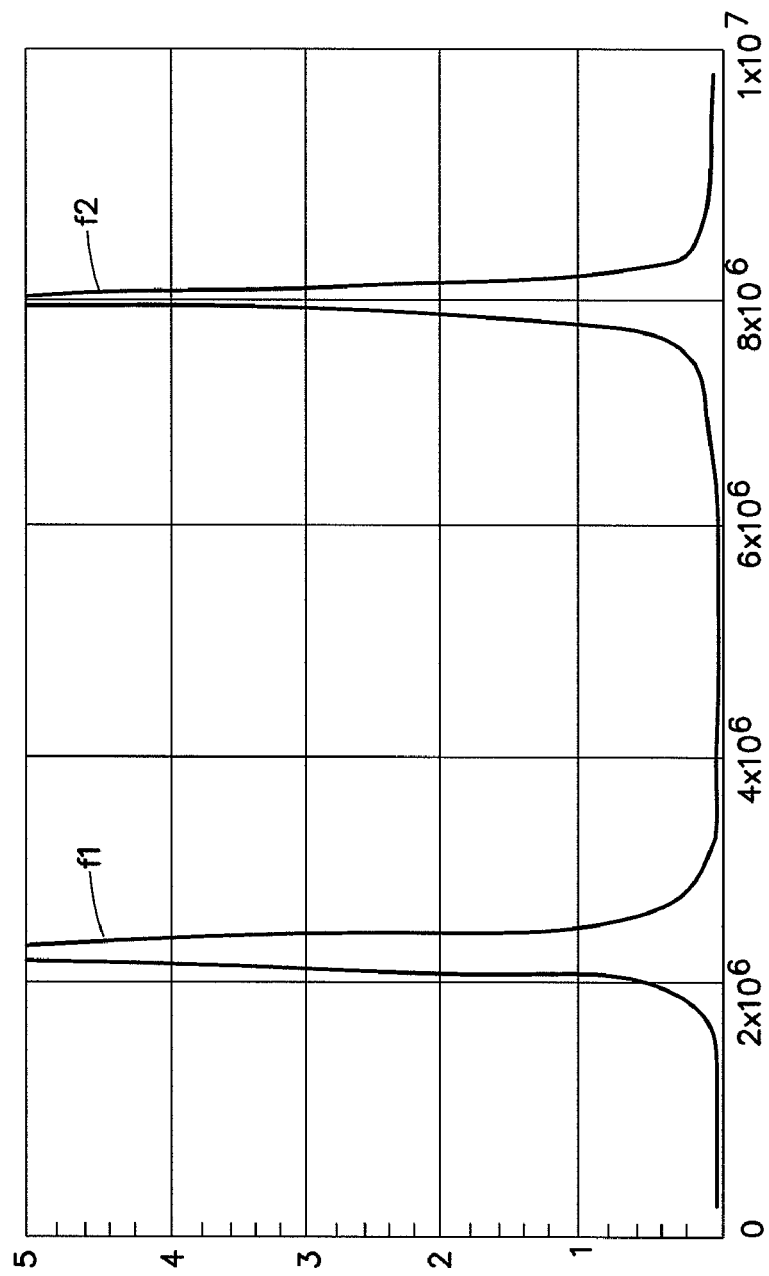
FIG. 3 illustrates a phase response in sampling time of notch filters used.

The multidimensional coefficients are subdivided into a static and a dynamic component, so as to determine static correction values on the line 212 and dynamic correction values on the line 214, respectively, which are then subtracted from the digital values on the line 206. Preferably, again, a control loop is formed via a notch filter arrangement, and the notch filter arrangement uses the test signal frequencies f1, f2 that were used to create the multidimensional coefficients sc, dc, as can be seen from the example of FIG. 3.

When using notch filters instead of phase-locked loops (PLLs) one should preferably make sure that few if any back-folded harmonics, created by converter nonlinearities, fall in the region around the test signal frequencies f1, f2, since the notch filters have a phase response there which adversely affects the determination of valid correction coefficients or even makes it impossible. The measurement frequencies or test signal frequencies f1, f2 can be chosen such as to approximate the subsequent useful signal, for example, they correspond to picture and sound carriers in the case of a television signal. The concept can be applied to all types of ADCs in the reduction of the coefficient field, especially in the case of folding ADCs, as long as such converters have a so-called memory.

Figure 4:
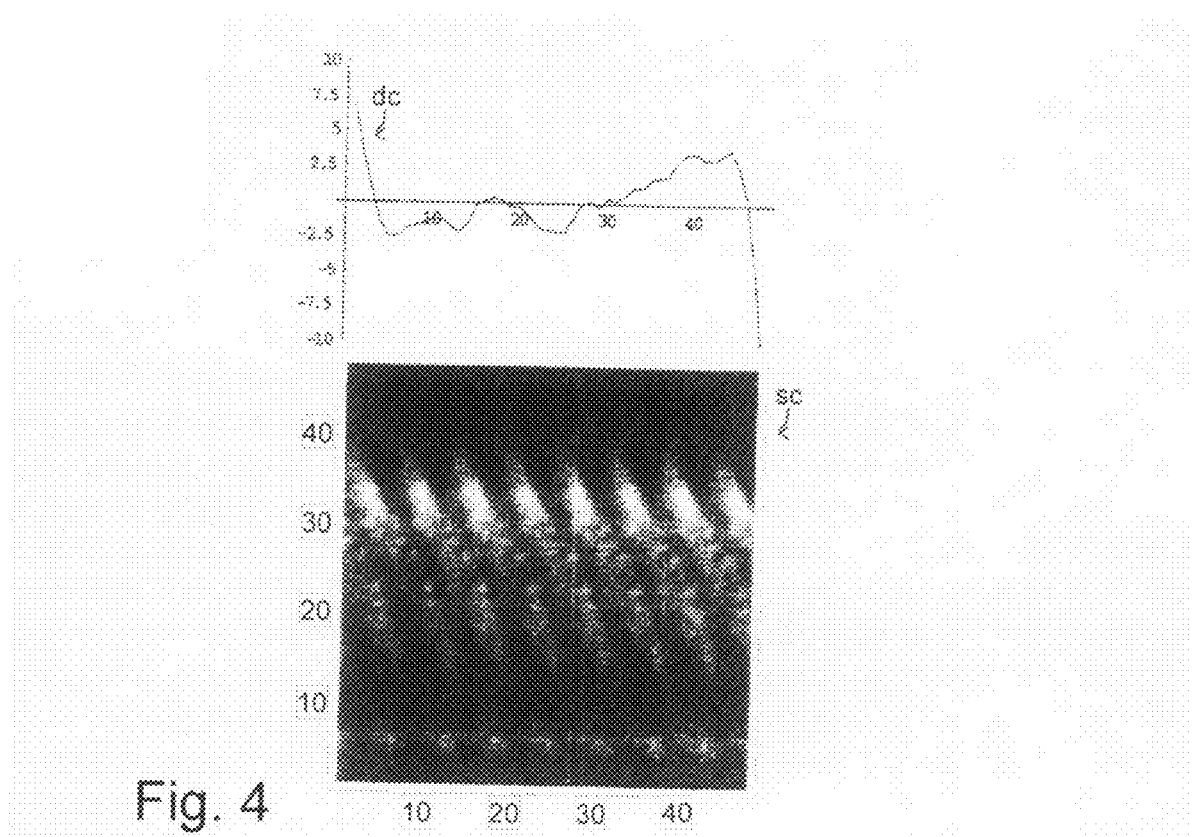
FIG. 4 illustrates a modulo 8 representation of dynamic coefficients in the lower part and static coefficients in the upper part.

FIG. 4 illustrates, for the case of a repetition rate mod8, a modulo 8 representation of the dynamic coefficients in the lower picture and the static coefficients in the upper picture.

Figures 5, 6:
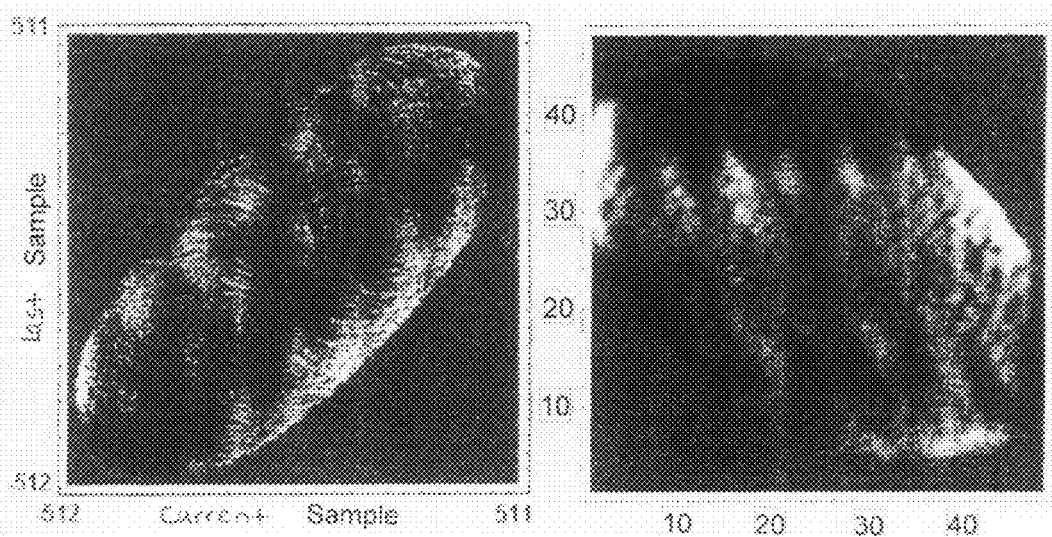
FIG. 5 illustrates a deviation of a converter characteristic from an original characteristic for a sampled value past history and two-tone modulation with negative deviations shown dark and positive deviations shown light.
FIG. 6 illustrates a 48×48 correction field with a difference between the last and the current sample value (y-axis) plotted against the current sample value (x-axis).

FIG. 5 illustrates a deviation of a converter characteristic from an original characteristic for a past sample value in the case of a two-tone modulation, negative deviations being shown dark and positive deviations shown light. The eightfold structure of the folding converter is clearly recognizable.

FIG. 6 illustrates a 48×48 correction field with a difference between the last and the current sample value, plotted against a current sample value. One can see that the eightfold structure comes to a height of the y-axis when plotting, instead of the past sample value, the difference between a past and a present sample value, as is depicted in FIG. 6. One observes the breaking up into an eightfold repeating dynamic and a static component, which can be used in the formation of the dynamic coefficient dc and the provision of the dynamic correction values kd using the repetition rate mod8. This enables, in particular, a distinct curtailment of the required overall storage space, thanks to a lower storage requirement in the second storage device DC for the dynamic coefficient dc. Of course, instead of the two storage devices 228, 230, one can also use a shared storage device. Neither is the breaking down of the correction device into two correction devices in the manner depicted absolutely necessary.

Although the present invention has been illustrated and described with respect to several preferred embodiments thereof, various changes, omissions and additions to the form and detail thereof, may be made therein, without departing from the spirit and scope of the invention.

What is claimed is:

1. A method for determining a characteristic of an analog-to-digital converter, comprising the steps of:
applying a test signal having a plurality of frequency components to an analog-to-digital converter to generate a digital output signal; and
comparing the digital output signal against a known test output signal, and depending on the result of the comparison generating a multidimensional correction coefficient for correction of signals being converted by the analog-to-digital converter.

2. The method of claim 1, further comprising notch filtering at several test signal frequencies (f1, f2) to generate the multidimensional correction coefficients.

3. The method of claim 1, wherein the test signal (a(f1+f2)) to determine the multidimensional correction coefficient is formed from at least two superimposed input signals of different test signal frequencies (f1, f2).

4. A method for compensating a characteristic of an analog-to-digital converter, comprising:
digitizing an analog input signal to provide a digital output signal; and
compensating the digital output signal with a multidimensional correction coefficient to provide a compensated digital output signal.

5. The method of claim 4, wherein for every further dimension of the at least one multidimensional coefficient (sc, dc), one considers an additional input value ($z^{-1}$) lying further in the past.

6. The method of claim 4, wherein the multidimensional correction coefficient comprises a static coefficient and at least one dynamic coefficient.

7. The method of claim 6, wherein a repetition rate of the dynamic coefficient is taken into account during the step of compensating.

8. The method of claim 7, wherein the repetition rate is set based upon a folding structure of the analog-to-digital converter.

9. The method of claim 7, wherein the rate of repetition of a number of correction fields is set accordingly through a modulation of the analog-to-digital converter.

10. The method of claim 4, further comprising notch filtering at a plurality of test frequency values to determine the multidimensional correction coefficients.

11. The method of claim 4, wherein a notch filtering is used, wherein parameters are adjusted to reduce harmonics that fall in regions around test signal frequencies (f1, f2) that were used to determine the at least one multidimensional coefficient.

12. A circuit arrangement for determining a characteristic of an analog-to-digital converter, comprising:
- an analog-to-digital converter that receives a test signal;
- a coefficient determining device for determining at least one multidimensional correction coefficient by comparing a digital output signal from the analog-to-digital converter with a desired state of the digital output signal; and
- a storage device for storing the at least one correction coefficient, wherein the coefficient determining device determines the at least one multidimensional coefficient with at least two dimensions as the basis for correction values for the analog-to-digital converter.

13. An analog-to-digital converter circuit arrangement, comprising:
- an analog-to-digital converter that receives an analog input signal and provides a digital output signal and;
- a correction device that corrects the digital output signal using a multidimensional correction coefficient indicative of a characteristic of the analog-to-digital converter to be compensated for, and provides a corrected digital output signal indicative thereof.

14. The circuit arrangement of claim 13, wherein the correction device provides a static correction value and a dynamic correction value, wherein the correction device subtracts both the static and dynamic correction values from the digital output value to provide the corrected digital output signal.

15. The circuit arrangement of claim 14 wherein the correction device comprises a modulo unit, depending on a repetition rate of a converter structure of the analog-to-digital converter.

16. The circuit arrangement of claim 14, wherein the digital output value is input to a first subtraction unit and to a delay unit that provides a delayed digital output value, and the delayed digital output value is also provided to the first subtraction unit that provides a difference signal, indicative of the difference between the digital output value and the delayed digital output value, to the correction device for generating the dynamic correction value.

17. The circuit arrangement of claim 16, further comprising a notch filter for filtering the digital output value in consideration of test signal frequencies (f1, f2) to provide a notch filtered signal that is input to the correction device to generate the multidimensional correction coefficient.

* * * * *